(12) United States Patent
Kweskin et al.

(10) Patent No.: US 8,476,142 B2
(45) Date of Patent: Jul. 2, 2013

(54) PREFERENTIAL DIELECTRIC GAPFILL

(75) Inventors: Sasha Kweskin, St. Louis, MO (US);
Hiroshi Hamana, Hyogo (JP); Paul Edward Gee, San Jose, CA (US);
Shankar Venkataraman, San Jose, CA (US); Kadar Sapre, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/052,238

(22) Filed: Mar. 21, 2011

(65) Prior Publication Data

US 2011/0250731 A1    Oct. 13, 2011

Related U.S. Application Data

(60) Provisional application No. 61/322,958, filed on Apr. 12, 2010.

(51) Int. Cl.
*H01L 21/76* (2006.01)

(52) U.S. Cl.
USPC .......................................... 438/427

(58) Field of Classification Search
USPC ................. 438/400, 424, 425, 427, 428, 435,
438/436, 437, 438, 442, 778, 784, 787, 788,
438/789, 790, FOR. 227, FOR. 221;
257/E21.273, E21.278, E21.494, E21.24,
257/E21.261, E21.262, E21.2, 63, E21.264,
257/E21.274, E21.275, E21.276, E21.277,
257/E21.545, E21.546, E21.548
See application file for complete search history.

(56) References Cited

U.S. PATENT DOCUMENTS

| | | | |
|---|---|---|---|
| 4,147,571 A | 4/1979 | Stringfellow et al. | |
| 4,816,098 A | 3/1989 | Davis et al. | |
| 4,818,326 A | 4/1989 | Liu et al. | |
| 4,931,354 A | 6/1990 | Wakino et al. | |
| 5,016,332 A | 5/1991 | Reichelderfer et al. | |
| 5,110,407 A | 5/1992 | Ono et al. | |
| 5,302,551 A * | 4/1994 | Iranmanesh et al. | 438/633 |

(Continued)

FOREIGN PATENT DOCUMENTS

| | | |
|---|---|---|
| DE | 19654737 A1 | 7/1997 |
| EP | 0892083 A1 | 1/1999 |

(Continued)

OTHER PUBLICATIONS

International Search Report and Written Opinion of PCT/US2011/029428 mailed Nov. 23, 2011, 8 pages.

(Continued)

*Primary Examiner* — Olik Chaudhuri
*Assistant Examiner* — Quovaunda V Jefferson
(74) *Attorney, Agent, or Firm* — Kilpatrick Townsend & Stockton, LLP

(57) ABSTRACT

Aspects of the disclosure pertain to methods of preferentially filling narrow trenches with silicon oxide while not completely filling wider trenches and/or open areas. In embodiments, dielectric layers are deposited by flowing a silicon-containing precursor and ozone into a processing chamber such that a relatively dense first portion of a silicon oxide layer followed by a more porous (and more rapidly etched) second portion of the silicon oxide layer. Narrow trenches are filled with dense material whereas open areas are covered with a layer of dense material and more porous material. Dielectric material in wider trenches may be removed at this point with a wet etch while the dense material in narrow trenches is retained.

13 Claims, 6 Drawing Sheets

U.S. PATENT DOCUMENTS

| | | | |
|---|---|---|---|
| 5,393,708 A | 2/1995 | Hsia et al. | |
| 5,426,076 A | 6/1995 | Moghadam | |
| 5,558,717 A | 9/1996 | Zhao et al. | |
| 5,587,014 A | 12/1996 | Leychika et al. | |
| 5,622,784 A | 4/1997 | Okaue et al. | |
| 5,635,409 A | 6/1997 | Moslehi | |
| 5,691,009 A | 11/1997 | Sandhu | |
| 5,707,888 A | 1/1998 | Aronowitz et al. | |
| 5,786,263 A | 7/1998 | Perera | |
| 5,853,607 A | 12/1998 | Zhao et al. | |
| 5,883,011 A * | 3/1999 | Lin et al. | 438/747 |
| 5,930,646 A * | 7/1999 | Gerung et al. | 438/431 |
| 5,937,308 A | 8/1999 | Gardner et al. | |
| 5,937,323 A | 8/1999 | Orczyk et al. | |
| 6,008,515 A | 12/1999 | Hsia et al. | |
| 6,009,830 A | 1/2000 | Li et al. | |
| 6,024,044 A | 2/2000 | Law et al. | |
| 6,087,243 A | 7/2000 | Wang | |
| 6,090,714 A * | 7/2000 | Jang et al. | 438/692 |
| 6,090,723 A | 7/2000 | Thakur et al. | |
| 6,140,242 A | 10/2000 | Oh et al. | |
| 6,146,970 A * | 11/2000 | Witek et al. | 438/424 |
| 6,156,581 A | 12/2000 | Vaudo et al. | |
| 6,165,834 A | 12/2000 | Agarwal et al. | |
| 6,180,490 B1 * | 1/2001 | Vassiliev et al. | 438/424 |
| 6,207,587 B1 | 3/2001 | Li et al. | |
| 6,287,962 B1 | 9/2001 | Lin | |
| 6,302,964 B1 | 10/2001 | Umotoy et al. | |
| 6,318,384 B1 | 11/2001 | Khan et al. | |
| 6,383,954 B1 | 5/2002 | Wang et al. | |
| 6,387,207 B1 | 5/2002 | Janakiraman et al. | |
| 6,406,677 B1 | 6/2002 | Carter et al. | |
| 6,448,187 B2 | 9/2002 | Yau et al. | |
| 6,503,557 B1 | 1/2003 | Joret | |
| 6,506,253 B2 | 1/2003 | Sakuma | |
| 6,508,879 B1 | 1/2003 | Hashimoto | |
| 6,509,283 B1 | 1/2003 | Thomas | |
| 6,524,931 B1 | 2/2003 | Perera | |
| 6,528,332 B2 | 3/2003 | Mahanpour et al. | |
| 6,531,412 B2 | 3/2003 | Conti et al. | |
| 6,544,900 B2 | 4/2003 | Raaijmakers et al. | |
| 6,548,416 B2 | 4/2003 | Han et al. | |
| 6,548,899 B2 | 4/2003 | Ross | |
| 6,559,026 B1 | 5/2003 | Rossman et al. | |
| 6,566,278 B1 | 5/2003 | Harvey et al. | |
| 6,569,736 B1 | 5/2003 | Hsu et al. | |
| 6,583,048 B1 | 6/2003 | Vincent et al. | |
| 6,589,868 B2 | 7/2003 | Rossman | |
| 6,596,654 B1 | 7/2003 | Bayman et al. | |
| 6,602,806 B1 | 8/2003 | Xia et al. | |
| 6,614,181 B1 | 9/2003 | Harvey et al. | |
| 6,624,064 B1 | 9/2003 | Sahin et al. | |
| 6,630,413 B2 | 10/2003 | Todd | |
| 6,645,303 B2 | 11/2003 | Frankel et al. | |
| 6,660,391 B1 | 12/2003 | Rose et al. | |
| 6,676,751 B2 | 1/2004 | Solomon et al. | |
| 6,683,364 B2 | 1/2004 | Oh et al. | |
| 6,716,770 B2 | 4/2004 | O'Neill et al. | |
| 6,727,190 B2 | 4/2004 | Srinivasan et al. | |
| 6,756,085 B2 | 6/2004 | Waldfried et al. | |
| 6,787,191 B2 | 9/2004 | Hanahata et al. | |
| 6,794,290 B1 | 9/2004 | Papasouliotis et al. | |
| 6,818,517 B1 | 11/2004 | Maes | |
| 6,819,886 B2 | 11/2004 | Runkowske et al. | |
| 6,830,624 B2 | 12/2004 | Janakiraman et al. | |
| 6,833,052 B2 | 12/2004 | Li et al. | |
| 6,833,322 B2 | 12/2004 | Anderson et al. | |
| 6,835,278 B2 | 12/2004 | Selbrede et al. | |
| 6,858,523 B2 | 2/2005 | Deboer et al. | |
| 6,867,086 B1 | 3/2005 | Chen et al. | |
| 6,867,152 B1 | 3/2005 | Hausmann et al. | |
| 6,872,323 B1 | 3/2005 | Entley et al. | |
| 6,890,403 B2 | 5/2005 | Cheung | |
| 6,900,067 B2 | 5/2005 | Kobayashi et al. | |
| 6,905,940 B2 | 6/2005 | Ingle et al. | |
| 6,955,836 B2 | 10/2005 | Kumagai et al. | |
| 6,958,112 B2 | 10/2005 | Karim et al. | |
| 7,018,902 B2 | 3/2006 | Visokay et al. | |
| 7,084,076 B2 | 8/2006 | Park et al. | |
| 7,087,536 B2 | 8/2006 | Nemani et al. | |
| 7,109,114 B2 | 9/2006 | Chen et al. | |
| 7,115,419 B2 | 10/2006 | Suzuki | |
| 7,122,222 B2 | 10/2006 | Xiao et al. | |
| 7,129,185 B2 | 10/2006 | Aoyama et al. | |
| 7,148,155 B1 | 12/2006 | Tarafdar et al. | |
| 7,183,177 B2 | 2/2007 | Al-Bayati et al. | |
| 7,192,626 B2 | 3/2007 | Dussarrat et al. | |
| 7,205,248 B2 | 4/2007 | Li et al. | |
| 7,220,461 B2 | 5/2007 | Hasebe et al. | |
| 7,297,608 B1 | 11/2007 | Papasouliotis et al. | |
| 7,335,609 B2 | 2/2008 | Ingle et al. | |
| 7,399,388 B2 | 7/2008 | Moghadam et al. | |
| 7,419,903 B2 | 9/2008 | Haukka et al. | |
| 7,435,661 B2 | 10/2008 | Miller et al. | |
| 7,456,116 B2 | 11/2008 | Ingle et al. | |
| 7,498,273 B2 | 3/2009 | Mallick et al. | |
| 7,524,735 B1 | 4/2009 | Gauri et al. | |
| 7,524,750 B2 | 4/2009 | Nemani et al. | |
| 7,541,297 B2 | 6/2009 | Mallick et al. | |
| 7,745,352 B2 | 6/2010 | Mallick et al. | |
| 7,790,634 B2 | 9/2010 | Munro et al. | |
| 7,803,722 B2 | 9/2010 | Liang | |
| 7,825,038 B2 | 11/2010 | Ingle et al. | |
| 7,825,044 B2 | 11/2010 | Mallick et al. | |
| 7,867,923 B2 | 1/2011 | Mallick et al. | |
| 7,902,080 B2 | 3/2011 | Chen et al. | |
| 7,935,643 B2 | 5/2011 | Liang et al. | |
| 7,943,531 B2 | 5/2011 | Nemani et al. | |
| 7,994,019 B1 | 8/2011 | Kweskin et al. | |
| 2001/0021595 A1 | 9/2001 | Jang et al. | |
| 2001/0029114 A1 | 10/2001 | Vulpio et al. | |
| 2001/0038919 A1 | 11/2001 | Berry, III et al. | |
| 2001/0054387 A1 | 12/2001 | Frankel et al. | |
| 2002/0017641 A1 | 2/2002 | Lu et al. | |
| 2002/0048969 A1 | 4/2002 | Suzuki et al. | |
| 2002/0081817 A1 | 6/2002 | Bhakta et al. | |
| 2002/0090834 A1 | 7/2002 | Lee et al. | |
| 2002/0127350 A1 | 9/2002 | Ishikawa et al. | |
| 2002/0142585 A1 | 10/2002 | Mandal | |
| 2002/0146879 A1 | 10/2002 | Fu et al. | |
| 2002/0164891 A1 | 11/2002 | Gates et al. | |
| 2003/0040199 A1 | 2/2003 | Agarwal | |
| 2003/0059535 A1 | 3/2003 | Luo et al. | |
| 2003/0064154 A1 | 4/2003 | Laxman et al. | |
| 2003/0118748 A1 | 6/2003 | Kumagai et al. | |
| 2003/0124873 A1 | 7/2003 | Xing et al. | |
| 2003/0143841 A1 | 7/2003 | Yang et al. | |
| 2003/0159656 A1 | 8/2003 | Tan et al. | |
| 2003/0172872 A1 | 9/2003 | Thakur et al. | |
| 2003/0199151 A1 | 10/2003 | Ho et al. | |
| 2003/0232495 A1 | 12/2003 | Moghadam et al. | |
| 2004/0008334 A1 | 1/2004 | Sreenivasan et al. | |
| 2004/0020601 A1 | 2/2004 | Zhao et al. | |
| 2004/0048492 A1 | 3/2004 | Ishikawa et al. | |
| 2004/0065253 A1 | 4/2004 | Pois et al. | |
| 2004/0079118 A1 | 4/2004 | M'Saad et al. | |
| 2004/0146661 A1 | 7/2004 | Kapoor et al. | |
| 2004/0152342 A1 | 8/2004 | Li et al. | |
| 2004/0161899 A1 | 8/2004 | Luo et al. | |
| 2004/0175501 A1 | 9/2004 | Lukas et al. | |
| 2004/0180557 A1 | 9/2004 | Park et al. | |
| 2004/0185641 A1 | 9/2004 | Tanabe et al. | |
| 2004/0219780 A1 | 11/2004 | Ohuchi | |
| 2004/0241342 A1 | 12/2004 | Karim et al. | |
| 2005/0001556 A1 | 1/2005 | Hoffman et al. | |
| 2005/0019494 A1 | 1/2005 | Moghadam et al. | |
| 2005/0026443 A1 | 2/2005 | Goo et al. | |
| 2005/0062165 A1 | 3/2005 | Saenger et al. | |
| 2005/0087140 A1 | 4/2005 | Yuda et al. | |
| 2005/0142895 A1 | 6/2005 | Ingle et al. | |
| 2005/0153574 A1 | 7/2005 | Mandal | |
| 2005/0181555 A1 | 8/2005 | Haukka et al. | |
| 2005/0186731 A1 | 8/2005 | Derderian et al. | |
| 2005/0186789 A1 | 8/2005 | Agarwal | |
| 2005/0196533 A1 | 9/2005 | Hasebe et al. | |
| 2005/0227499 A1 | 10/2005 | Park et al. | |
| 2005/0250340 A1 | 11/2005 | Chen et al. | |

| 2005/0282404 | A1 | 12/2005 | Nguyen et al. |
|---|---|---|---|
| 2006/0011984 | A1 | 1/2006 | Curie |
| 2006/0014399 | A1 | 1/2006 | Joe |
| 2006/0030165 | A1 | 2/2006 | Ingle et al. |
| 2006/0055004 | A1 | 3/2006 | Gates et al. |
| 2006/0068599 | A1 | 3/2006 | Baek et al. |
| 2006/0075966 | A1 | 4/2006 | Chen et al. |
| 2006/0096540 | A1 | 5/2006 | Choi |
| 2006/0110943 | A1 | 5/2006 | Swerts et al. |
| 2006/0121394 | A1 | 6/2006 | Chi |
| 2006/0162661 | A1 | 7/2006 | Jung et al. |
| 2006/0178018 | A1 | 8/2006 | Olsen |
| 2006/0223315 | A1 | 10/2006 | Yokota et al. |
| 2006/0228903 | A1 | 10/2006 | McSwiney et al. |
| 2006/0281496 | A1 | 12/2006 | Cedraeus |
| 2006/0286776 | A1 | 12/2006 | Ranish et al. |
| 2007/0020392 | A1 | 1/2007 | Kobrin et al. |
| 2007/0026689 | A1 | 2/2007 | Nakata et al. |
| 2007/0049044 | A1 | 3/2007 | Marsh |
| 2007/0077777 | A1 | 4/2007 | Gumpher |
| 2007/0092661 | A1 | 4/2007 | Ryuzaki et al. |
| 2007/0128864 | A1 | 6/2007 | Ma et al. |
| 2007/0132054 | A1 | 6/2007 | Arghavani et al. |
| 2007/0173073 | A1 | 7/2007 | Weber |
| 2007/0181966 | A1 | 8/2007 | Watatani et al. |
| 2007/0232071 | A1 | 10/2007 | Balseanu et al. |
| 2007/0232082 | A1 | 10/2007 | Balseanu et al. |
| 2007/0275569 | A1 | 11/2007 | Moghadam et al. |
| 2007/0281495 | A1 | 12/2007 | Mallick et al. |
| 2007/0281496 | A1 | 12/2007 | Ingle et al. |
| 2008/0000423 | A1 | 1/2008 | Fukiage |
| 2008/0085607 | A1 | 4/2008 | Yu et al. |
| 2008/0102223 | A1 | 5/2008 | Wagner et al. |
| 2008/0102650 | A1 | 5/2008 | Adams et al. |
| 2008/0188087 | A1 | 8/2008 | Chen et al. |
| 2008/0311754 | A1 | 12/2008 | Chandrasekaran et al. |
| 2008/0318429 | A1 | 12/2008 | Ozawa et al. |
| 2009/0029523 | A1* | 1/2009 | Seo et al. ............ 438/425 |
| 2009/0061647 | A1 | 3/2009 | Mallick et al. |
| 2009/0104755 | A1 | 4/2009 | Mallick et al. |
| 2009/0104790 | A1 | 4/2009 | Liang |
| 2009/0325391 | A1 | 12/2009 | De Vusser et al. |
| 2010/0159711 | A1 | 6/2010 | Venkataraman et al. |
| 2010/0221925 | A1 | 9/2010 | Lee et al. |
| 2011/0014798 | A1 | 1/2011 | Mallick et al. |
| 2011/0034035 | A1 | 2/2011 | Liang et al. |
| 2011/0034039 | A1 | 2/2011 | Liang et al. |
| 2011/0045676 | A1 | 2/2011 | Park et al. |
| 2011/0111137 | A1 | 5/2011 | Liang et al. |

FOREIGN PATENT DOCUMENTS

| EP | 1213759 | * | 6/2002 |
|---|---|---|---|
| EP | 1717848 | A | 11/2006 |
| JP | 01241826 | A | 9/1989 |
| JP | 2007-134420 | A | 5/2007 |
| KR | 10-2004-0091978 | A | 11/2004 |
| KR | 10-2005-0003758 | A | 1/2005 |
| KR | 10-2005-0094183 | A | 9/2005 |
| KR | 10-2007-0063821 | A | 6/2007 |
| WO | WO 02/077320 | A1 | 10/2002 |
| WO | WO 03/066933 | A | 8/2003 |
| WO | WO 2005/078784 | A | 8/2005 |
| WO | WO 2007/040856 | A2 | 4/2007 |
| WO | WO 2007/140376 | A | 12/2007 |
| WO | WO 2007/140424 | A | 12/2007 |

OTHER PUBLICATIONS

International Search Report and Written Opinion of PCT/US2008/065973 mailed on Aug. 26, 2008, 10 pages.

International Search Report and Written Opinion of PCT/US2009/065181 mailed on Jun. 29, 2010., 6 pages.

Aylett, B. J. et al., "Silicon-Nitrogen Compounds. Part V. Diphenylamino-derivatives of Silane," J. Chem. Soc. (A), 1969, pp. 636-638.

Aylett, B. J. et al., "Silicon-Nitrogen Compounds. Part VI.[1] The Preparation and Properties of Disilazane," J. Chem. Soc. (A), 1969, pp. 639-642.

Aylett, B. J. et al., "The Preparation and Some Properties of Disilylamine-Correspondence," Inorganic Chemistry, 1966, p. 167.

Beach, David B., "Infrared and Mass Spectroscopic Study of the Reaction of Silyl Iodide and Ammonia. Infrared Spectrum to Silylamine," Inorganic Chemistry, 1992, pp. 4174-4177, vol. 31 No. 20.

Burg, Anton B. et al., "Silyl-Amino Boron Compounds," J. Amer. Chem. Soc., Jul. 1950, pp. 3103-3107, vol. 72.

Coltrin, M.E., et al., "Chemistry of AlGaN Particulate Formation," National Nuclear Security Administration, Physical, Chemical, & Nano Sciences Center, Research Briefs, 2005, pp. 42-43.

Davison, A et al., "The Raman Spectra of Manganese and Rhenium Carbonyl Hydrides and Some Related Species," Inorganic Chemistry, Apr. 1967, pp. 845-847, vol. 6 No. 4.

Dussarrat, C. et al., "Low Pressure Chemical Vapor Deposition of Silicon Nitride Using Mono- and Disilyiamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages.

French, P.J. et al., "Low-temperature BPSG Reflow Compatible with Surface Micromachining," J. Micromech, Microeng. 5 (1995) 125-127.

Gulleri, G. et al., "Deposition Temperature Determination of HDPCVD Silicon Dioxide Films," 2005, Microelectronic Engineering, vol. 82, pp. 236-241.

Kang, Hun, "A Study of the Nucleation and Formation of Multi-functional Nanostructures using GaN-Based Materials for Device Applications," Georgia Institute of Technology, Doctor of Philosophy in the School of Electrical & Computer Engineering Dissertation, Dec. 2006, p. 14.

Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.

Lucovsky, G,. et al., "Deposition of silicon dioxide and silicon nitride by remote plasma enhanced chemical vapor deposition," Journal of Vacuum Science & Technology, vol. 4, No. 3, May-Jun. 1986, pp. 681-688.

Norman, Arlan D. et al., "Reaction of Silylphosphine with Ammonia," Inorganic Chemistry, 1979, pp. 1594-1597, vol. 18 No. 6.

Sujishi, Sei et al., "Effect of Replacement of Carbon by Silicon in Trimethylamine on the Stabilities of the Trimethylboron Addition Compounds. Estimation of the Resonance Energy for Silicon-Nitrogen Partial Double Bond," Amer. Chem. Soc., Sep. 20, 1954, pp. 4631-4636, vol. 76.

Tsu, D. V. et al., "Silicon Nitride and Silicon Diimide Grown By Remote Plasma Enhanced Chemical Vapor Deposition", Journal of Vacuum Science and Technology: Part A, AVS/AIP, Melville, NY.; US, vol. 4, No. 3, Part 01, May 1, 1986, pp. 480-485.

Ward, L. G. L. et al., "The Preparation and Properties of *Bis*-Disilanyl Sulphide and *Tris*-Disilanylamine," J. Inorg. Nucl. Chem., 1961, pp. 287-293, vol. 21, Pergamon Press Ltd., Northern Ireland.

Ward, Laird G. L., "Bromosilane, Iodosilane, and Trisilyamine," Inorganic Syntheses, 1968, pp. 159-170, vol. 11.

* cited by examiner

PREFERENTIAL DIELECTRIC GAPFILL

CROSS-REFERENCES TO RELATED APPLICATIONS

This application claims the benefit of U.S. Provisional Application No. 61/322,958 by Kweskin et al, filed Apr. 12, 2010 and titled "PREFERENTIAL DIELECTRIC GAPFILL" which is incorporated herein in its entirety for all purposes.

BACKGROUND OF THE INVENTION

Semiconductor device geometries continue to decrease in size, providing more devices per unit area on a fabricated wafer. These devices are typically initially isolated from each other as they are built into the wafer, and they are subsequently interconnected to create desired circuit configurations. Some devices are fabricated with feature dimensions of several tens of nanometers. Spacing between doped-semiconductor devices and conductive lines on a patterned wafer may be separated by spacings similar to feature dimensions, leaving recesses or gaps of a comparable size. A nonconductive layer of dielectric material, such as silicon oxide (SiO2), is typically deposited over features to fill gaps and electrically isolate features from one another in an integrated circuit.

Dielectric layers are used in various applications including shallow trench isolation (STI) dielectric for isolating devices and interlayer dielectric (ILD) formed between metal wiring layers or prior to a metallization process (PMD). A generic patterned substrate 110 is shown in FIG. 1 filled with silicon oxide 120-1. The patterned substrate 110 has a relatively open area to the right and a trench to the left. After depositing silicon oxide over the patterned substrate 110, the silicon oxide outside the trench is typically removed by a variety of techniques including chemical mechanical polishing (CMP).

The silicon oxide in the narrow trench is desirable and the silicon oxide in the open area to the right may or may not be desirable. Chemical mechanical polishing often removes one region at a different rate than another to the spatial pattern variation. In FIG. 1, the polish has penetrated into the open area more than the narrow trench, an effect known as dishing. Dishing is rarely desirable since the material in the open area is not completely removed nor is it flush with the level of the silicon oxide in the narrow trench. Process sequences need to be modified (e.g. costly steps must be added) in order to reduce or address the effects of dishing.

Therefore, a need exists for methods of depositing silicon oxide in narrow trenches while retaining additional control over the material left in open areas and wide trenches of a patterned substrate.

BRIEF SUMMARY OF THE INVENTION

Aspects of the disclosure pertain to methods of preferentially filling narrow trenches with silicon oxide while not completely filling wider trenches and/or open areas. In embodiments, dielectric layers are deposited by flowing a silicon-containing precursor and ozone into a processing chamber such that a relatively dense first portion of a silicon oxide layer followed by a more porous (and more rapidly etched) second portion of the silicon oxide layer. Narrow trenches are filled with dense material whereas open areas are covered with a layer of dense material and more porous material. Dielectric material in wider trenches may be removed at this point with a wet etch while the dense material in narrow trenches is retained.

Embodiments of the invention include methods of processing a patterned substrate having a narrow trench and an open area. The methods include flowing a silicon-containing precursor and ozone ($O_3$) into a substrate processing region containing the patterned substrate. The methods further include forming a dense portion of silicon oxide, filling the narrow trench and covering an exposed horizontal surface of the open area. The methods further include forming a porous portion of silicon oxide over the dense portion. The porous portion predominantly forms above the narrow trench and not within the narrow trench. The method further includes stripping the porous portion of the silicon oxide using a wet etch.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

DETAILED DESCRIPTION OF THE INVENTION

Aspects of the disclosure pertain to methods of preferentially filling narrow trenches with silicon oxide while not completely filling wider trenches and/or open areas. In embodiments, dielectric layers are deposited by flowing a silicon-containing precursor and ozone into a processing chamber such that a relatively dense first portion of a silicon oxide layer followed by a more porous (and more rapidly etched) second portion of the silicon oxide layer. Narrow trenches are filled with dense material whereas open areas are covered with a layer of dense material and more porous material. Dielectric material in wider trenches may be removed at this point with a wet etch while the dense material in narrow trenches is retained.

Embodiments of the invention are directed to methods of forming silicon oxide preferentially in narrow trenches on a patterned surface of a substrate. Sub-atmospheric CVD (SACVD) and related processes involve flowing a silicon-containing precursor and an oxidizing precursor into a processing chamber to form silicon oxide on the substrate. The silicon-containing precursor may include TEOS and the oxidizing precursor may include ozone ($O_3$), oxygen ($O_2$) and/or oxygen radicals. The inventors have discovered that a transition from high-density to low-density growth during the growth of dielectric layers may be exploited to preferentially fill narrow gaps with high density materials. Open areas and wide trenches behave differently from narrow trenches because they are filled with both high and low density dielectric. This allows dielectric material in open areas and wide trenches to be removed by, e.g., a wet etch while material remains in the narrow trenches.

Figure 1A:
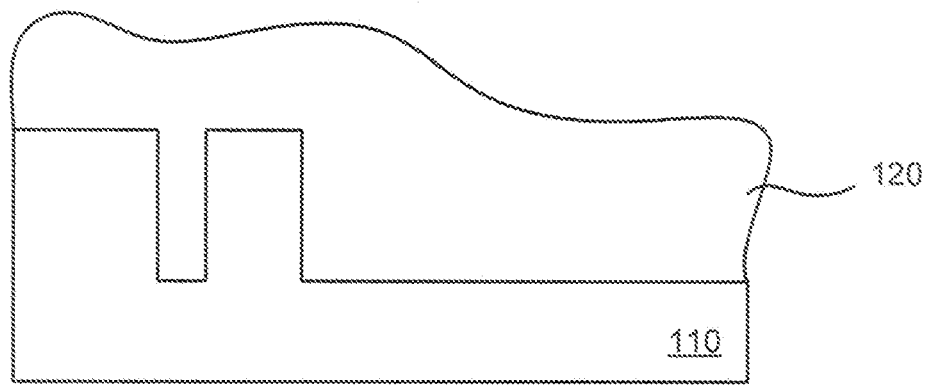
FIG. 1A-1B are cross-sections of a patterned substrate during a prior art narrow gapfill process.
Figure 1B:
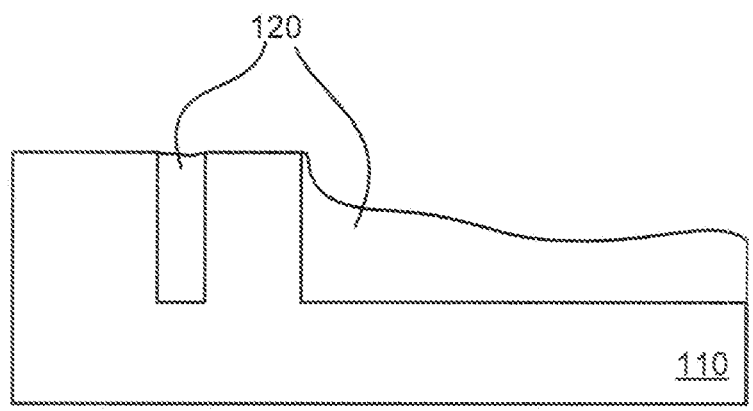
Figure 2:
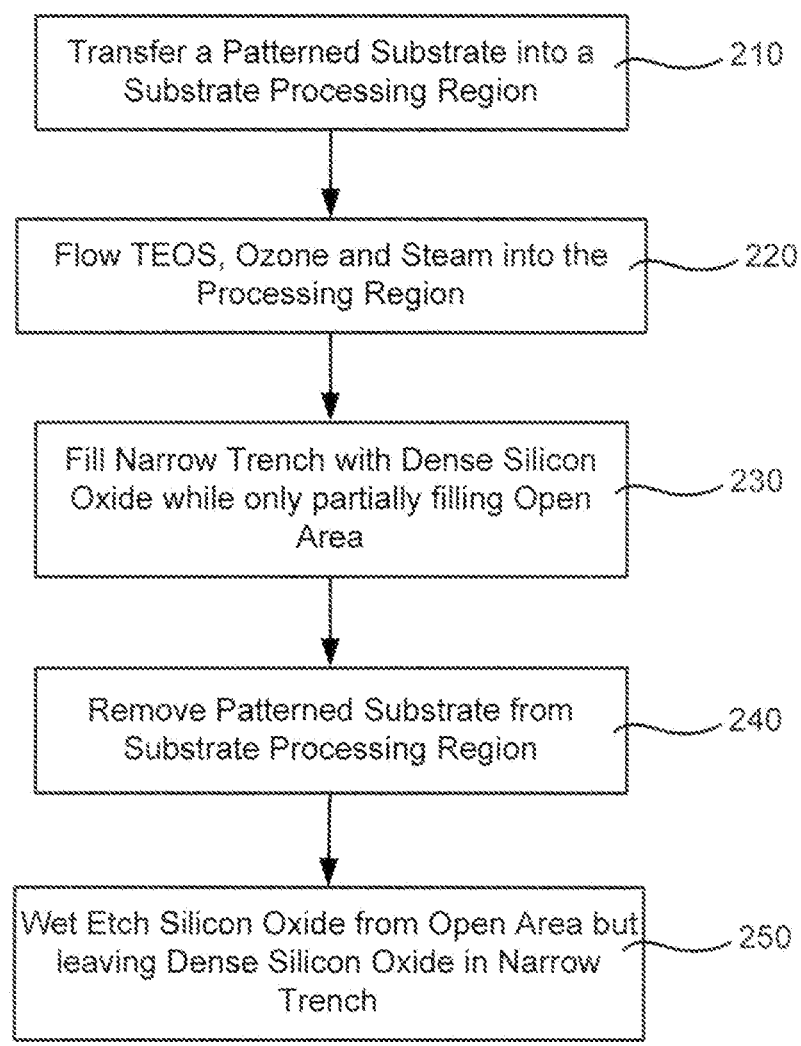
FIG. 2 is a flow chart of a preferential narrow gapfill process according to embodiments of the invention.
Figure 3A:
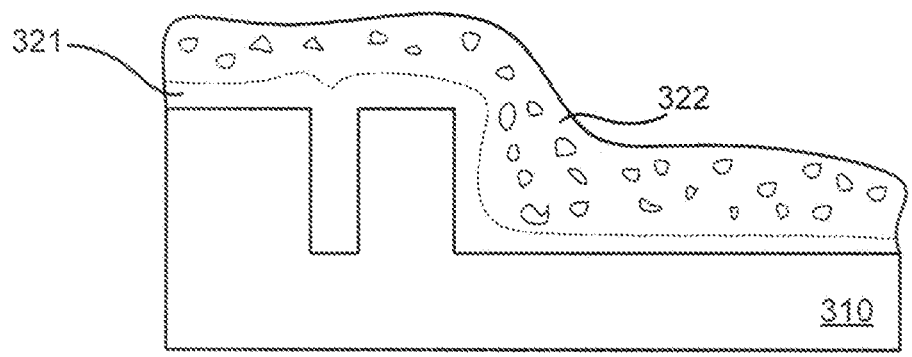
FIG. 3A-3B are cross-sections of a patterned substrate during a preferential narrow gapfill process according to embodiments of the present invention.
Figure 3B:
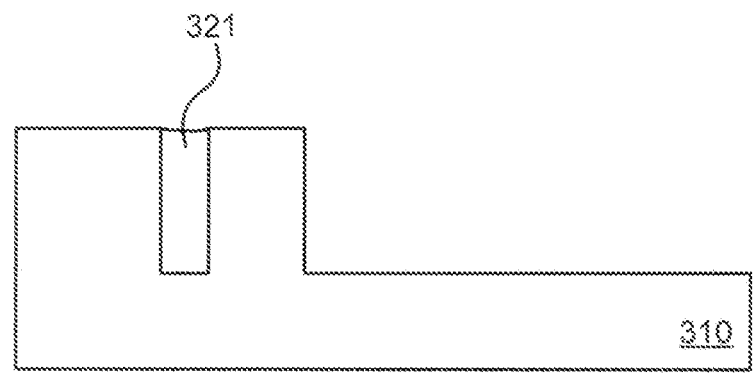

In order to better understand and appreciate the invention, reference is now made to FIGS. 2 and 3A-3B which are a flow chart of a preferential gapfill process and cross-sections of a patterned substrate during the process according to disclosed embodiments. The process 200 in FIG. 1A begins when a patterned substrate 310 is transferred into a substrate processing region (operation 210). TEOS, ozone and steam ($H_2O$) are flowed into the region in operation 220 and a dense conformal layer of silicon oxide 321 begins to grow out from the exposed surfaces of the patterned substrate (operation 240). The narrow trench fills with dense silicon oxide 321 and then the growth transitions to porous silicon oxide 322 thereafter. Note that the open area (which may be a wide trench) is filled with both porous 322 and dense silicon oxide 321 whereas the narrow trench is filled predominantly with dense silicon oxide 321.

After the heterogeneous silicon oxide layer is deposited, the patterned substrate 310 is removed from the substrate processing region in operation 240. The patterned substrate 310 is then treated using a wet etch (operation 250) to remove some of the deposited material. The wet etch may be any of a variety of wet etch solutions designed to remove the deposited dielectric. A typical wet etch solution for silicon oxide films includes a HF buffered oxide etch, in disclosed embodiments, though other solutions may be included or substituted. The wet etch process parameters (including duration) are chosen to remove at least the porous portion of the silicon oxide and typically some of the dense portion as well. During exposure to a buffered oxide etch, the wet etch rate of the porous portion of silicon oxide may exceed that of the dense portion by a multiplicative factor of one of 2, 3, 4, 5, 7 or 10, in different embodiments.

FIG. 3B shows an embodiment where the wet etch proceeds until the dense silicon oxide is removed from the open area such that open area is exposed as it was before the deposition operation. The horizontal surfaces near the top of the narrow trench may also be exposed as shown. The dense silicon oxide predominantly remains in the narrow trench, in part, because of the dense silicon oxide deposited above the trench as shown in FIG. 3A. The presence of the dense silicon oxide above the trench delays the penetration of the wet etch into the gapfill silicon oxide inside the trench. Some of the gapfill may be removed, in embodiments, causing a slight recess of the gapfill inside the narrow trench. The mean height of the gapfill silicon oxide may be flush with the top of the trench or within one of 5%, 3%, 2%, 1% or 0.5% of the top of the trench, in different embodiments. Each of these ranges are considered within the scope of an "essentially" filled narrow trench as used herein.

The open area is shown in FIGS. 3A-3B as coplanar with the bottom of the narrow trench. Alternatively, the open area may be coplanar with the top of the narrow trench or in a plane parallel to the top and the bottom of the trench. The open area may also occupy a plane between those two planes, in other words, the open area is partially recessed from the top of the trench.

As indicated, a transition from dense silicon oxide growth to porous silicon oxide growth occurs during the deposition of the heterogeneous silicon oxide layer in operation 230. This transition and the density of the porous silicon oxide portion may depend on a number of process parameters. The inclusion of water (steam) along with TEOS and ozone has been found to increase the porosity of the porous portion of the silicon oxide layer. Depositing the heterogeneous silicon oxide layer at low temperature has also been found to increase this porosity. Therefore, lowering the substrate temperature is desirable not only to help stay within tightening thermal budgets, but also to increase the utility of the techniques presented herein. The temperature of the substrate during the deposition of the heterogeneous silicon oxide layer is below one of 540° C., 500° C., 450° C., 400° C. and 350° C., in different embodiments.

Narrow trenches are filled with dense silicon oxide when the width of the trench is less than or about half the thickness of the dense portion of the heterogeneous silicon oxide film. Depending on process parameters, the thickness of the dense portion may be between 5 and 25 nm or between 10 and 20 nm, in different embodiments. The width of the narrow trench may be less than one of 100 nm, 50 nm, 35 nm, 30 nm, 25 nm or 20 nm, and the height of the narrow trench may be greater than one of 50 nm, 100 nm, 150 nm, 200 nm, 300 nm or 500 nm, in different embodiments. As indicated earlier, the open area may be a wide trench and that wide trench may have a width greater than one of 100 nm, 150 nm, 200 nm, 500 nm, 1000 nm or 2000 nm, and the height may be the same or less than the height of the narrow trench in different embodiments. The open area may also be flush (coplanar) with the top of the trench; in this case the open area is not recessed at all.

During the formation of dense silicon oxide in the narrow trench, methods known in the art for minimizing seams and voids may be used. These precautions ensure the density inside the trench is more uniform which ensures the wet etch process of operation 250 will not penetrate into the gapfill silicon oxide so far as to compromise the electrical isolation provided.

Trenches wider than twice the thickness of the dense portion of the deposited silicon oxide may also be productively filled. By repeating the deposition/wet etch sequence more than once, trenches somewhat wider than twice the thickness may be filled while still allowing the dense silicon oxide deposited in the open area to be removed during the last wet etch. The benefits are possible because of the restricted geometry of the narrow trench which presents a longer path of porous dielectric through which the wet etch must penetrate before beginning to remove the dense silicon oxide lining the narrow trench. Even without the additional path-length of porous dielectric, a wet etch process is typically less effective at removing material from a restricted geometry, in part, because of the reduced ability of a fluid to penetrate narrow passageways and a reduced ability to displace spent etching agent with unspent etching agent.

Additional process parameters are described in the course of outlining exemplary systems and deposition chambers.

Exemplary Substrate Processing System

Deposition chambers that may implement embodiments of the present invention may include sub-atmospheric chemical vapor deposition (SACVD) chambers and more generally, deposition chambers which allow operation at relatively high pressures without necessarily applying plasma excitation. Specific examples of CVD systems that may implement embodiments of the invention include the CENTURA ULTIMA® SACVD chambers/systems, and PRODUCER® HARP, eHARP and SACVD chambers/systems, available from Applied Materials, Inc. of Santa Clara, Calif.

Figure 4:
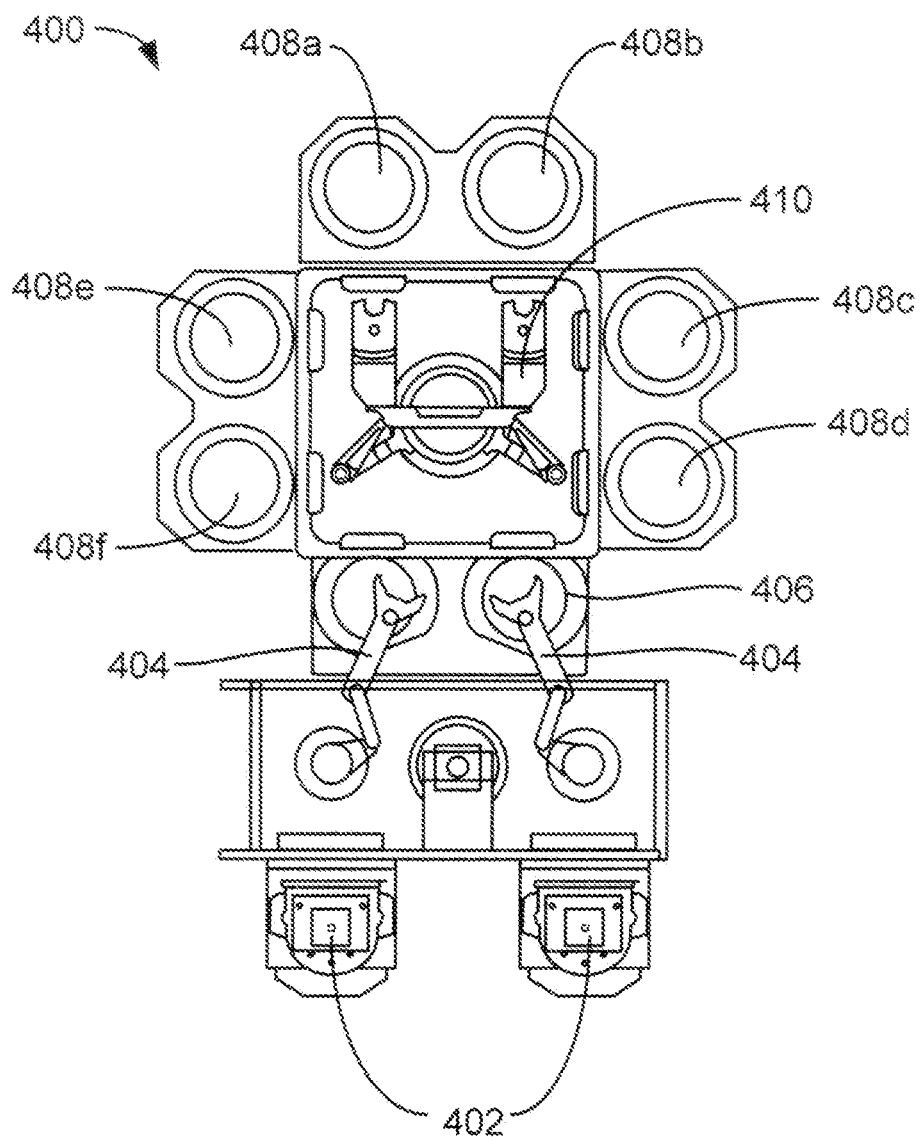
FIG. 4 shows a substrate processing system according to embodiments of the invention.

Embodiments of the deposition systems may be incorporated into larger fabrication systems for producing integrated circuit chips. FIG. 4 shows one such system 400 of deposition, baking and curing chambers according to disclosed embodiments. In the figure, a pair of FOUPs (front opening unified pods) 402 supply substrate substrates (e.g., 300 mm diameter wafers) that are received by robotic arms 404 and placed into a low pressure holding area 406 before being placed into one of the wafer processing chambers 408a-f. A second robotic arm 410 may be used to transport the substrate wafers from the holding area 406 to the processing chambers 408a-f and back.

The processing chambers 408a-f may include one or more system components for depositing, annealing, curing and/or etching a flowable dielectric film on the substrate wafer. In one configuration, two pairs of the processing chamber (e.g., 408c-d and 408e-f) may be used to deposit the flowable dielectric material on the substrate, and the third pair of processing chambers (e.g., 408a-b) may be used to anneal the deposited dielectric. In another configuration, the same two pairs of processing chambers (e.g., 408c-d and 408e-f) may be configured to both deposit and anneal a flowable dielectric film on the substrate, while the third pair of chambers (e.g., 408a-b) may be used for UV or E-beam curing of the deposited film. In still another configuration, all three pairs of chambers (e.g., 408a-f) may be configured to deposit and cure a flowable dielectric film on the substrate. In yet another configuration, two pairs of processing chambers (e.g., 408c-d and 408e-f) may be used for both deposition and UV or E-beam curing of the flowable dielectric, while a third pair of processing chambers (e.g. 408a-b) may be used for annealing the dielectric film. Any one or more of the processes described may be carried out on chamber(s) separated from the fabrication system shown in different embodiments.

Figure 5A:
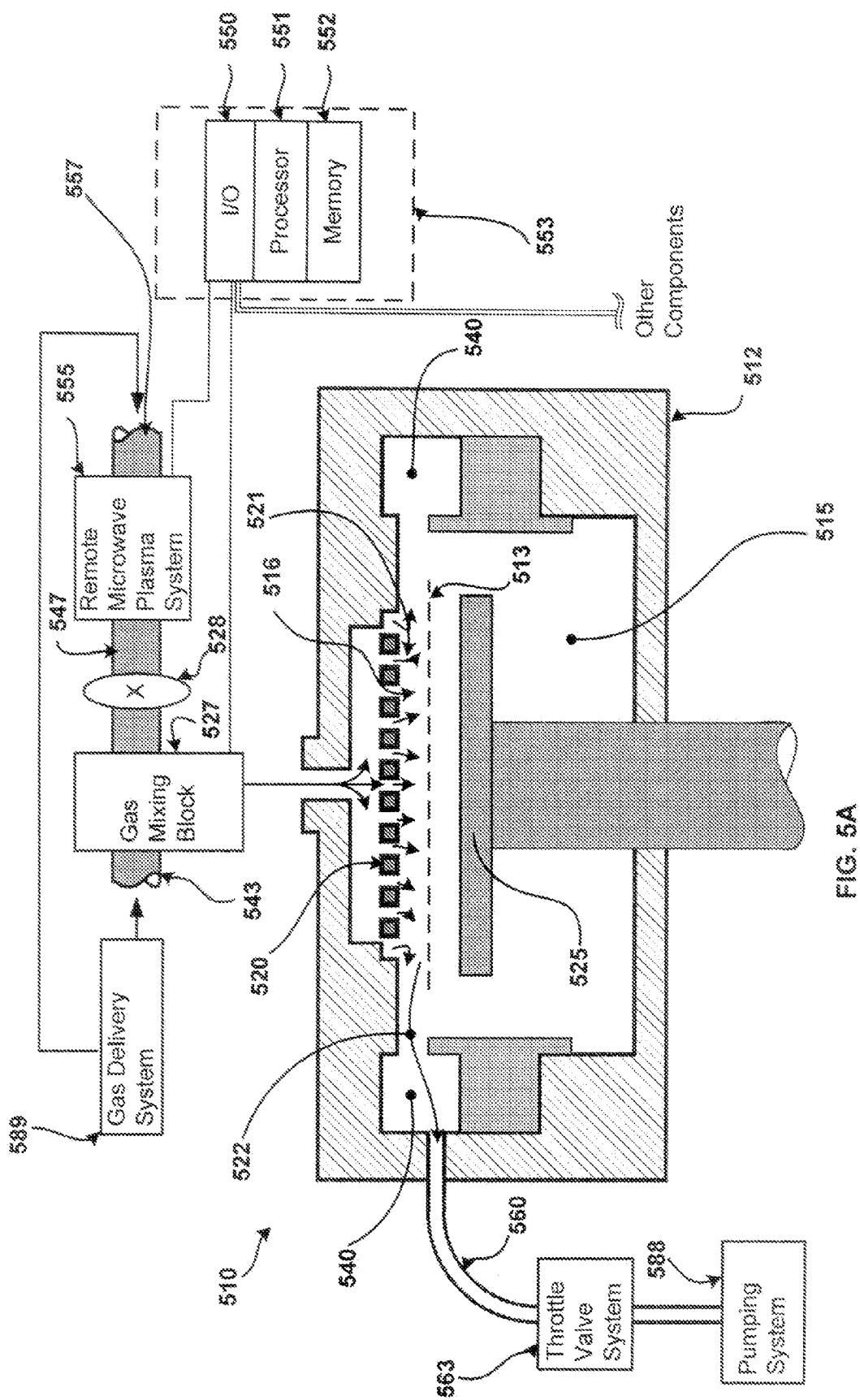
FIG. 5A shows a simplified representation of a semiconductor processing chamber according to embodiments of the present invention.

FIG. 5A shows a simplified representation of an exemplary semiconductor processing chamber within a semiconductor processing tool 400. This exemplary chamber 510 is suitable for performing a variety of semiconductor processing steps which may include CVD processes, as well as other processes, such as reflow, drive-in, cleaning, etching, and gettering processes. Multiple-step processes can also be performed on a single substrate without removing the substrate from the chamber. Representative major components of the system include a chamber interior 515 that receives process and other gases from a gas delivery system 589, pumping system 588, a remote plasma system (RPS) 555, and a control system 553. These and other components are described below in order to understand the present invention.

The semiconductor processing chamber 510 includes an enclosure assembly 512 housing a chamber interior 515 with a gas reaction area 516. A gas distribution plate 520 is provided above the gas reaction area 516 for dispersing reactive gases and other gases, such as purge gases, through perforated holes in the gas distribution plate 520 to a substrate (not shown) that rests on a vertically movable heater 525 (which may also be referred to as a substrate support pedestal). The heater 525 can be controllably moved between a lower position, where a substrate can be loaded or unloaded, for example, and a processing position closely adjacent to the gas distribution plate 520, indicated by a dashed line 513, or to other positions for other purposes, such as for an etch or cleaning process. A center board (not shown) includes sensors for providing information on the position of the substrate.

Gas distribution plate 520 may be of the variety described in U.S. Pat. No. 6,793,733. These plates improve the uniformity of gas disbursement at the substrate and are particularly advantageous in deposition processes that vary gas concentration ratios. In some examples, the plates work in combination with the vertically movable heater 525 (or movable substrate support pedestal) such that deposition gases are released farther from the substrate when the ratio is heavily skewed in one direction (e.g., when the concentration of a silicon-containing gas is small compared to the concentration of an oxidizer-containing gas) and are released closer to the substrate as the concentration changes (e.g., when the concentration of silicon-containing gas in the mixture is higher). In other examples, the orifices of the gas distribution plate are designed to provide more uniform mixing of the gases.

The heater 525 includes an electrically resistive heating element (not shown) enclosed in a ceramic. The ceramic protects the heating element from potentially corrosive chamber environments and allows the heater to attain temperatures up to about 800° C. In an exemplary embodiment, all surfaces of the heater 525 exposed within the chamber interior 515 are made of a ceramic material, such as aluminum oxide ($Al_2O_3$ or alumina) or aluminum nitride.

Reactive and carrier gases are supplied through inlet tube 543 into mixing box 527, where they are preferably mixed together and delivered to the gas distribution plate 520. Mixing box 527 is preferably a dual input mixing block coupled to inlet tube 543 and to a cleaning/etch gas conduit 547. A valve 528 operates to admit or seal gas or plasma from conduit 547 to mixing box 527. Conduit 547 receives gases from an RPS 555, which has an inlet 557 for receiving input gases. During deposition processing, gas supplied to the plate 520 is vented toward the substrate surface (as indicated by arrows 521), where it may be uniformly distributed radially across the substrate surface, typically in a laminar flow.

Purging gas may be delivered into the chamber interior 515 through the plate 520 and/or an inlet port or tube (not shown) through a wall (preferably the bottom) of enclosure assembly 512. The purging gas flows upward from the inlet port past the heater 525 and to an annular pumping channel 540 and may be useful to purge the chamber, for example, between depositions. An exhaust system then exhausts the gas (as indicated by arrow 522) into the annular pumping channel 540 and through an exhaust line 560 to a pumping system 588, which includes one or more vacuum pumps. Exhaust gases and entrained particles are drawn from the annular pumping channel 540 through the exhaust line 560 at a rate controlled by a throttle valve system 563.

The RPS 555 can produce a plasma for selected applications, such as chamber cleaning or etching native oxide or residue from a process substrate. Plasma species produced in the remote plasma system 555 from precursors supplied via the input line 557 are sent via conduit 547 for dispersion through the plate 520 to the gas reaction area 516. Precursor gases for a cleaning application may include fluorine, chlorine, and other reactive elements. The RPS 555 also may be adapted to deposit plasma enhanced CVD films by selecting appropriate deposition precursor gases for use in the RPS 555.

During formation of the heterogeneous silicon oxide layer, the flow of TEOS is generally effected by flowing a carrier gas (e.g. $N_2$) through liquid TEOS such that the delivery rate of TEOS into the substrate processing region is above one of 1 g/min, 2 g/min or 3 g/min, in different embodiments. Both the carrier gas and the TEOS will typically enter the substrate processing region. The flow of ozone is delivered along with more stable molecular oxygen. The flow rate of the ozone portion of that flow is above one of 1 slm, 2 slm, 3 slm, 5 slm or 10 slm, in different embodiments.

The pressure in the substrate processing region are typical of many SACVD and HARP processes (e.g. 600 Ton). The pressure during the formation of the heterogenous silicon oxide film may be greater than one of 350 Torr, 400 Ton, 450 Torr, 500 Ton or 550 Ton, in different embodiments, to ensure desirable growth rates during the incubation period. Despite the name and acronym for the related process, sub-atmospheric chemical vapor deposition (SACVD), it should be noted that the processes described herein may be performed at pressures higher than atmospheric pressure (typically 760 Torr). No plasma is present in the substrate processing region in some embodiments. A small ac and/or dc voltage may be applied to the substrate processing region without detriment to the benefits of the deposition process, according to embodiments. Such an excitation should not be considered to deviate from the scope of "essentially" plasma-free or a process having "essentially" no plasma as may be recited in some claims.

Flow rates, as used herein, are not necessarily constant during the process. Flow rates of the different precursors may be initiated and terminated in different orders and their magnitudes may be varied. Unless otherwise indicated, mass flow rate magnitudes indicated herein are given for the approximate peak flow rate used during the process. Flow rate magnitudes indicated herein are for deposition on one side of a pair of 300 mm diameter wafers (area approximately 1400 $cm^2$). Appropriate correction based on deposition area is needed for a different number of wafers, larger or smaller wafers, double sided deposition or deposition on alternative geometry substrates (e.g. rectangular substrates).

The system controller 553 controls activities and operating parameters (e.g. pressure and flow rates) of the deposition system. The processor 551 executes system control software, such as a computer program stored in a memory 552 coupled to the processor 551. The memory 552 typically consists of a combination of static random access memories (cache), dynamic random access memories (DRAM) and hard disk drives but of course the memory 552 may also consist of other kinds of memory, such as solid-state memory devices. In addition to these memory means the semiconductor processing chamber 510 in a preferred embodiment includes a removable storage media drive, USB ports and a card rack (not shown).

The processor 551 operates according to system control software programmed to operate the device according to the methods disclosed herein. For example, sets of instructions may dictate the timing, mixture of gases, chamber pressure, chamber temperature, plasma power levels, susceptor position, and other parameters for carrying out one or more incubation period depositions in a sequence. The instructions are conveyed to the appropriate hardware preferably through direct cabling carrying analog or digital signals conveying signals originating from an input-output I/O module 550. Other computer programs such as those stored on other memory including, for example, a USB thumb drive, a floppy disk or another computer program product inserted in a disk drive or other appropriate drive, may also be used to operate the processor 551 to configure the semiconductor processing chamber 510 for varied uses.

The processor 551 may have a card rack (not shown) that contains a single-board computer, analog and digital input/output boards, interface boards and stepper motor controller boards. Various parts of the semiconductor processing system 200 conform to the Versa Modular European (VME) standard which defines board, card cage, and connector dimensions and types. The VME standard also defines the bus structure having a 16-bit data bus and 24-bit address bus.

A process for preferentially filling narrow trenches on a patterned substrate or a process for cleaning a chamber can be implemented using a computer program product that is executed by the system controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller is via a flat-panel touch-sensitive monitor. In the preferred embodiment two monitors are used, one mounted in the clean room wall for the operators and the other behind the wall for the service technicians. The two monitors may simultaneously display the same information, in which case only one accepts input at a time. To select a particular screen or function, the operator touches a designated area of the touch-sensitive monitor. The touched area changes its highlighted color, or a new menu or screen is displayed, confirming communication between the operator and the touch-sensitive monitor. Other devices, such as a keyboard, mouse, or other pointing or communication device, may be used instead of or in addition to the touch-sensitive monitor to allow the user to communicate with the system controller.

The embodiment disclosed herein relies on direct cabling and a single processor 551. Alternative embodiments comprising multi-core processors, multiple processors under distributed control and wireless communication between the system controller and controlled objects are also possible.

Figure 5B:
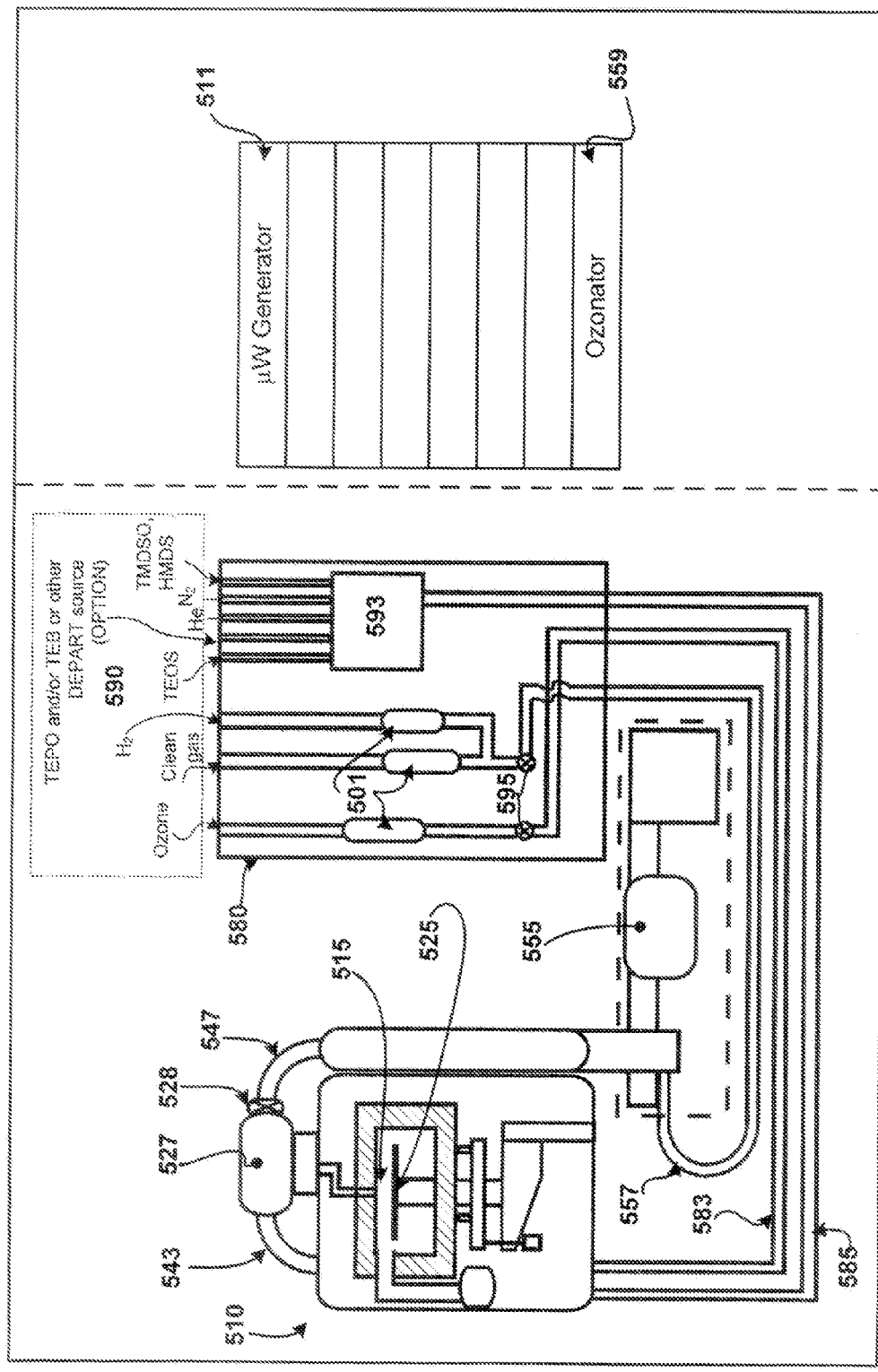
FIG. 5B shows a simplified representation of a gas panel and supply lines in relation to a processing chamber.

FIG. 5B shows a simplified representation of a gas supply panel 580 in relation to semiconductor processing chamber 510. As discussed above, the portion of semiconductor processing system 200 shown includes semiconductor processing chamber 510 with a heater 525, mixing box 527 with inputs from inlet tube 543 and conduit 547, and RPS 555 with input line 557. As mentioned above, the mixing box 527 is configured for mixing and injecting deposition gas(es) and cleaning gas(es) or other gas(es) through inlet tube 543 and the input line 557 to the chamber interior 515.

The RPS 555 is integrally located and mounted below the processing chamber 510 with conduit 547 coming up alongside the chamber 510 to the gate valve 528 and the mixing box 527, located above the chamber 510. Plasma power generator 511 and ozonator 559 are located remote from the clean room. Supply lines 583 and 585 from the gas supply panel 580 provide reactive gases to inlet tube 543. The gas supply panel 580 includes lines from gas or liquid sources 590 that provide the process gases for the selected application. The gas supply panel 580 has a mixing system 593 that mixes selected gases before flow to the mixing box 527. In some embodiments, gas mixing system 593 includes a liquid injection system for vaporizing one or more reactant liquids such as tetraethylorthosilicate ("TEOS"), triethylborate ("TEB"), and triethylphosphate ("TEPO"). Vapor from the liquids is usually combined with a carrier gas, such as helium. Supply lines for the process gases may include (i) shut-off valves 595 that can be used to automatically or manually shut off the flow of process gas into supply line 585 or line 557, and (ii) liquid flow meters (LFM) 501 or other types of controllers that measure the flow of gas or liquid through the supply lines.

As an example, a mixture including TEOS as a silicon source may be used with gas mixing system 593 in a deposition process for forming a silicon oxide film during an incubation period. Sources of dopants such as phosphorous and boron may include TEPO and TEB which may also be introduced to gas mixing system 593. Precursors delivered to gas mixing system 593 may be liquid at room temperature and pressure and may be vaporized by conventional boiler-type or bubbler-type hot boxes. Alternatively, a liquid injection system may be used and offers greater control of the volume of reactant liquid introduced into the gas mixing system. The liquid is typically injected as a fine spray or mist into the carrier gas flow before being delivered to a heated gas delivery line 385 to the gas mixing block and chamber. Oxygen ($O_2$) and ozone ($O_3$) flow to the chamber through another supply line 583, to be combined with the reactant gases from supply line 585 near or in the chamber. Of course, it is recognized that other sources of dopants, silicon, oxygen and additive precursors may also be used. Though shown as an individual gas distribution line, supply line 585 may actually comprise multiple lines separated to discourage inter-precursor reactions before the precursors are flowed into chamber interior 515.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A layer of "silicon oxide" may include minority concentrations of other elemental constituents such as nitrogen, hydrogen, carbon and the like. A gas may be a combination of two or more gases. The terms trench and gap are used interchangeably throughout with no implication that the etched geometry necessarily has a large horizontal aspect ratio. Viewed from above the surface, gaps may appear circular, oval, polygonal, rectangular, or a variety of other shapes. Gaps may also be a region between two pillars in which case the gaps are not physical separate from other gaps. As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of processing a patterned substrate having a narrow trench and an open area, the method comprising:
   flowing a silicon-containing precursor and ozone ($O_3$) into a substrate processing region containing the patterned substrate;
   forming a dense portion of silicon oxide, filling the narrow trench and covering an exposed horizontal surface of the open area;
   forming a porous portion of silicon oxide over the dense portion, wherein the porous portion predominantly forms above the narrow trench and not within the narrow trench; and
   stripping the porous portion of the silicon oxide using a wet etch, wherein the open area is the bottom of a wide trench and the wide trench contain material from both the dense portion and the porous portion prior to the stripping operation, and wherein the operation of stripping the porous portion further comprises removing the dense portion of silicon oxide above the open area such that the open area is again exposed.

2. The method of claim 1 wherein the narrow trench is essentially filled by the dense portion of silicon oxide.

3. The method of claim 1 wherein the operation of stripping the porous portion further comprises removing some of the dense portion above the narrow trench but leaving the narrow trench essentially filled.

4. The method of claim 1 wherein a plane containing the exposed horizontal surface of the open area is coplanar with the top of the trench.

5. The method of claim 1 wherein a plane containing the exposed horizontal surface of the open area is recessed from a plane which includes the top of the trench.

6. The method of claim 5 wherein the plane containing the exposed horizontal surface of the open area is coplanar with the bottom of the trench.

7. The method of claim 1 wherein a wet etch rate of the porous portion of silicon oxide exceeds that of the dense portion by a multiplicative factor of 2, in an HF buffered oxide etch.

8. The method of claim 1 wherein a width of the narrow trench is less than 100 nm.

9. The method of claim 1 wherein a depth of the narrow trench is greater than 50 nm.

10. The method of claim 1 wherein the open area comprises a wide trench having a width greater than 100 nm.

11. The method of claim 1 further comprising the operation of flowing steam into the substrate processing region concurrently with the flows of the silicon-containing precursor and ozone.

12. The method of claim 1 wherein the silicon-containing precursor is TEOS.

13. The method of claim 1 wherein the porous portion is formed on the dense portion with essentially no intervening layer.

* * * * *